United States Patent
Tsukuda

(10) Patent No.: US 9,484,948 B2
(45) Date of Patent: Nov. 1, 2016

(54) CLOCK GENERATION CIRCUIT

(71) Applicant: Sony Semiconductor Solutions Corporation, Kanagawa (JP)

(72) Inventor: Yasunori Tsukuda, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 16 days.

(21) Appl. No.: 14/539,293

(22) Filed: Nov. 12, 2014

(65) Prior Publication Data
US 2015/0162917 A1 Jun. 11, 2015

(30) Foreign Application Priority Data
Dec. 10, 2013 (JP) ................. 2013-254860

(51) Int. Cl.
*H03L 7/197* (2006.01)
*H03M 3/00* (2006.01)
*H03K 21/02* (2006.01)

(52) U.S. Cl.
CPC ............ *H03M 3/30* (2013.01); *H03K 21/02* (2013.01); *H03K 21/023* (2013.01); *H03L 7/197* (2013.01)

(58) Field of Classification Search
CPC .... H03K 21/02; H03K 21/023; H03L 7/197; H03L 7/1974; H03L 7/1976; H03M 3/30
See application file for complete search history.

(56) References Cited

U.S. PATENT DOCUMENTS

| 7,415,092 B2 * | 8/2008 | Itri ................... H04L 7/0091 327/156 |
| 7,436,227 B2 * | 10/2008 | Thomsen ............ H03L 1/022 327/147 |
| 7,548,121 B2 * | 6/2009 | Wang .................. H03L 7/087 331/11 |
| 7,583,774 B2 * | 9/2009 | Lesso ................. H03L 7/087 327/105 |
| 7,679,454 B2 * | 3/2010 | Kuan .................. H03L 7/081 331/11 |
| 8,674,731 B1 * | 3/2014 | Hellmer ............. H03L 7/0992 327/147 |

FOREIGN PATENT DOCUMENTS

JP 2013-005050 1/2013

* cited by examiner

*Primary Examiner* — Patrick O'Neill
(74) *Attorney, Agent, or Firm* — Michael Best & Friedrich LLP

(57) ABSTRACT

The present technique relates to a clock generation circuit including a phase difference comparison circuit configured to compare a phase of each of an input clock signal and a feedback signal, and provides a phase difference signal indicating a phase difference between the input clock signal and the feedback signal, a filter circuit configured to suppress a high frequency component in the phase difference signal, an output circuit configured to modulate the phase difference signal in such a manner as to decrease a noise component of a low frequency band and increase a noise component of a high frequency band, and generate and output an output clock signal from the modulated phase difference signal and a reference clock signal, and a frequency dividing circuit configured to divide a frequency of the output clock signal, at a predetermined frequency dividing ratio, and feed it back to the phase comparison circuit.

8 Claims, 9 Drawing Sheets

CLOCK GENERATION CIRCUIT

CROSS REFERENCE TO RELATED APPLICATIONS

This application claims the benefit of Japanese Priority Patent Application JP 2013-254860 filed on Dec. 10, 2013, the entire contents of which are incorporated herein by reference.

TECHNICAL FIELD

The present technique relates to a clock generation circuit. More particularly, the present technique relates to a clock generation circuit for multiplying a frequency of a clock signal and outputting the signal.

BACKGROUND ART

In the past, electronic devices use various types of clock generation circuits in order to generate various kinds of clock signals. For example, a clock generation circuit having an NCO (Numerical Controlled Oscillator), a loop filter, and a DLL (Delay Locked Loop) has been suggested (for example, see PTL 1). This clock generation circuit outputs an overflow signal by changing the count value of the NCO on the basis of phase information. By using this overflow signal as a clock signal, a clock signal of any given average frequency can be attained. In this clock generation circuit, the amount of jitter is reduced in the overflow signal given by the NCO by further increasing the time precision with a DLL in a later stage. In this clock generation circuit, a loop filter can be constituted by a digital circuit for a low frequency reference clock signal, and therefore, as compared with the case where an analog filter is used, the loop band can be reduced with a smaller size of implementation area.

CITATION LIST

Patent Literature

[PTL 1]
JP 2013-5050 A

SUMMARY

Technical Problem

However, in the conventional technique explained above, periodical jitter component remains in the clock signal generated by the NCO and the DLL. When a PLL (Phase Locked Loop) is used in the clock generation circuit, a jitter having a higher frequency component than the loop band of the PLL can be suppressed. However, even when the PLL is used, a clock signal still including a jitter of a low frequency component generated by the NCO and the DLL are output. For this reason, there is a problem in that the clock generation circuit may not sufficiently reduce the noise in the clock signal which is output. The present technique is made in view of such circumstances, and the present inventors have recognized that the present technique to reduce the noise in the clock signal.

Solution to Problem

The present technique is made to solve the above problems, and the first aspect is a clock generation circuit including a phase difference comparison circuit configured to compare a phase of each of an input clock signal and a feedback signal which have been input, and provides a phase difference signal indicating a phase difference between the input clock signal and the feedback signal, a filter circuit configured to suppress a high frequency component, of which frequency is higher than a predetermined cutoff frequency, in the phase difference signal, an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal, and a frequency dividing circuit configured to divide a frequency of the output clock signal, which has been output, at a predetermined frequency dividing ratio, and feed the output clock signal back to the phase comparison circuit as the feedback signal. Therefore, there is an advantage in that the output clock signal is generated from the modulated phase difference signal and the reference clock signal.

In this first aspect, the output circuit may include a modulator configured to modulate the phase difference signal of which high frequency component has been suppressed, and a multiplier circuit configured to multiply the reference clock signal by a multiplication ratio according to the phase difference indicated by the frequency dividing ratio setting signal which has been modulated, and output the output clock signal. Therefore, there is an advantage in that the reference clock signal is multiplied by the multiplication ratio according to the phase difference.

In this first aspect, the output circuit may further include an adjustment unit configured to adjust the phase difference indicated by the phase difference signal so that it attains a value obtained by multiplying a ratio of a frequency of the reference clock signal with respect to a frequency of the input clock signal by the predetermined frequency dividing ratio, and input the phase difference signal indicating the adjusted value into the modulator. Therefore, there is an advantage in that the phase difference is adjusted to attain the value obtained by multiplying the ratio of the frequency of the reference clock signal with respect to the frequency of the input clock signal by the predetermined frequency dividing ratio.

In this first aspect, the multiplier circuit may include a phase difference detector configured to compare phases of the reference clock signal and an internal signal, and detect a phase difference between the reference clock signal and the internal signal, an oscillator configured to oscillate at a frequency according to the phase difference detected by the phase difference detector, and generate the output clock signal, and a variable frequency divider configured to divide a frequency of the output clock signal, which has been generated, at a frequency dividing ratio equal to the value indicated by the phase difference signal which has been modulated, and feed the output clock signal back to the phase difference detector as the internal signal. Therefore, there is an advantage in that the frequency of the output clock signal is divided by the frequency dividing ratio equal to the value indicated by the phase difference signal.

In this first aspect, the clock generation circuit may further include a detection circuit configured to provide the phase comparison circuit with a detection result obtained by detecting an edge of the input clock signal on the basis of a clock signal of a frequency higher than the input clock signal. Therefore, there is an advantage in that the edge of the input clock signal is detected on the basis of the clock signal of a frequency higher than the input clock signal.

In this first aspect, the detection circuit may detect an edge of the input clock signal on the basis of the output clock signal. Therefore, there is an advantage in that the edge of the input clock signal is detected on the basis of the output clock signal.

In this first aspect, the modulation performed on the phase difference signal may be sigma delta modulation. Therefore, there is an advantage in that the sigma delta modulation is performed on the phase difference signal. The second aspect of the present technique is an electronic device including a reference clock providing circuit configured to provide a predetermined reference clock signal, a phase difference comparison circuit configured to compare a phase of each of an input clock signal and a feedback signal which have been input, and provides a phase difference signal indicating a phase difference between the input clock signal and the feedback signal, a filter circuit configured to suppress a high frequency component, of which frequency is higher than a predetermined cutoff frequency, in the phase difference signal, an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal, and a frequency dividing circuit configured to divide a frequency of the output clock signal, which has been output, at a predetermined frequency dividing ratio, and feed the output clock signal back to the phase comparison circuit as the feedback signal. Therefore, there is an advantage in that the output clock signal is generated from the modulated phase difference signal and the reference clock signal.

Advantageous Effects of Invention

The present technique achieves a superior effect of reducing noises in a clock signal. It should be noted that the advantages described here is not particularly limited, and any one of the advantages described in the present disclosure may be achieved.

DESCRIPTION OF EMBODIMENTS

Hereinafter, modes for carrying out the present technique (hereinafter referred to as embodiments) will be explained. It should be noted that the explanation will be made in the following order.

1. First embodiment (example of generation of an output clock signal by modulating a phase difference signal)

2. Second embodiment (example of generation of an output clock signal by controlling a phase of an input clock signal and modulating a phase difference signal)

1. First Embodiment

Example of Configuration of Electronic Device

Figure 1:
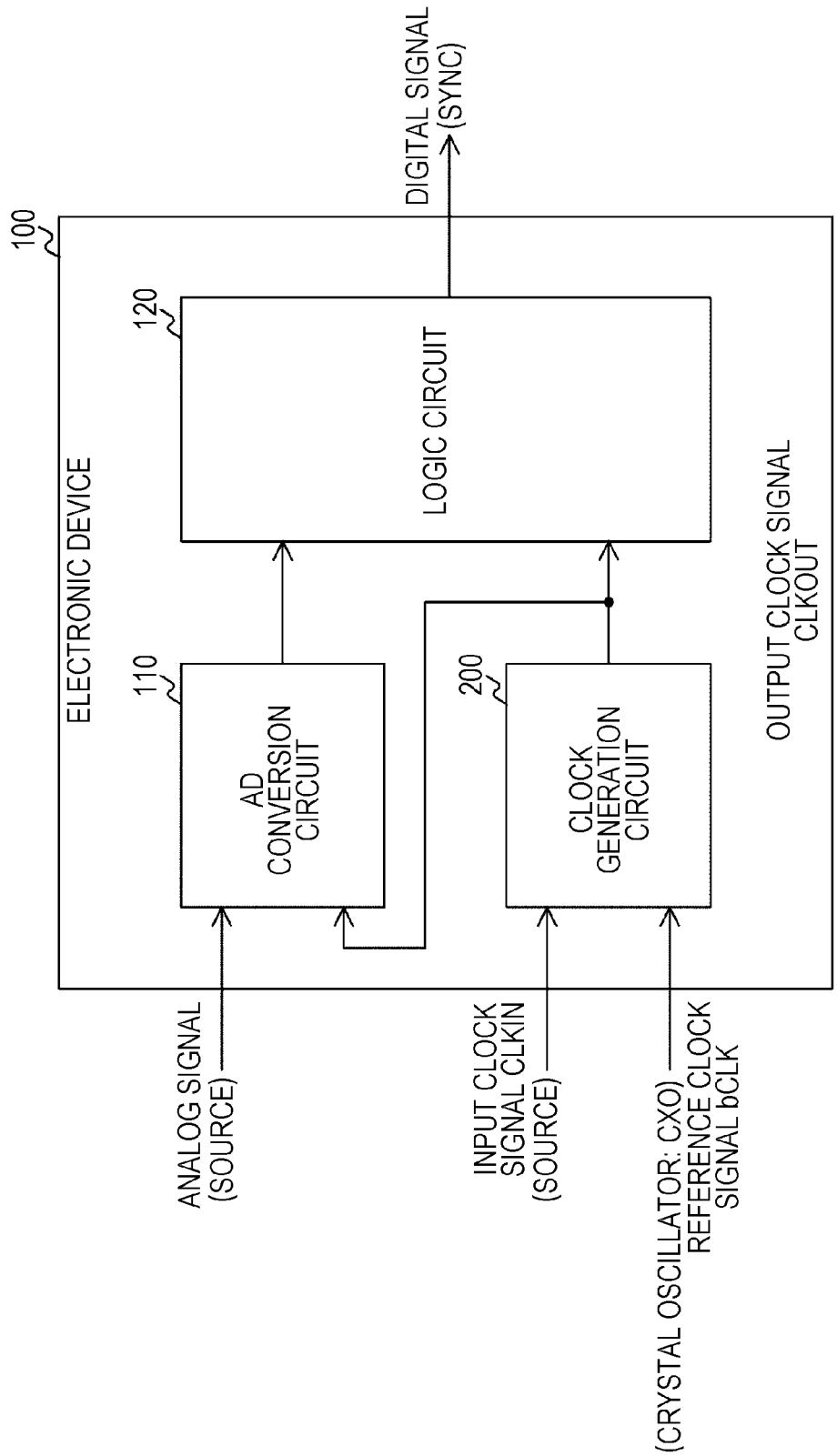
FIG. 1 is a block diagram illustrating an example of configuration of an electronic device according to a first embodiment.

FIG. 1 is a block diagram illustrating an example of configuration of an electronic device 100 according to the first embodiment. This electronic device 100 includes an AD (Analog-to-Digital) conversion circuit 110, a logic circuit 120, and a clock generation circuit 200.

The clock generation circuit 200 generates an output clock signal CLKOUT from an input clock signal CLKIN and a reference clock signal bCLK. In this case, the input clock signal CLKIN is, for example, a horizontal synchronization signal, and is transmitted from the source of a video player and the like to the clock generation circuit 200. It should be noted that the reference clock signal bCLK is a clock signal of which frequency is constant, and is, for example, provided from a crystal oscillator CXO to the clock generation circuit 200. The frequency of the input clock signal CLKIN is, for example, 10 kHz, and the frequency of the reference clock signal bCLK is, for example, 48 MHz. Although the crystal oscillator CXO is provided outside of the electronic device 100, the crystal oscillator CXO may be provided inside of the electronic device 100. The crystal oscillator CXO is an example of a reference clock providing circuit as described in the claims.

The clock generation circuit 200 uses the reference clock signal bCLK to generate the output clock signal CLKOUT by multiplying the frequency of the input clock signal CLKIN, and provides it to the AD conversion circuit 110 and logic circuit 120. The details of the generation method of the output clock signal CLKOUT will be explained later. The AD conversion circuit 110 converts the analog signal into a digital signal in synchronization with the output clock signal CLKOUT. In this case, the analog signal is a video signal, an audio signal, and the like, and is transmitted from a source to the AD conversion circuit 110. The AD conversion circuit 110 provides the digital signal to the logic circuit 120.

The logic circuit 120 performs predetermined processing on the digital signal in synchronization with the output clock signal CLKOUT. For example, image processing, decoding processing, noise reduction processing, and the like are performed on the digital signal. The logic circuit 120 provides the processed digital signal to a sink such as a display device.

[Example of Configuration of Clock Generation Circuit]

Figure 2:
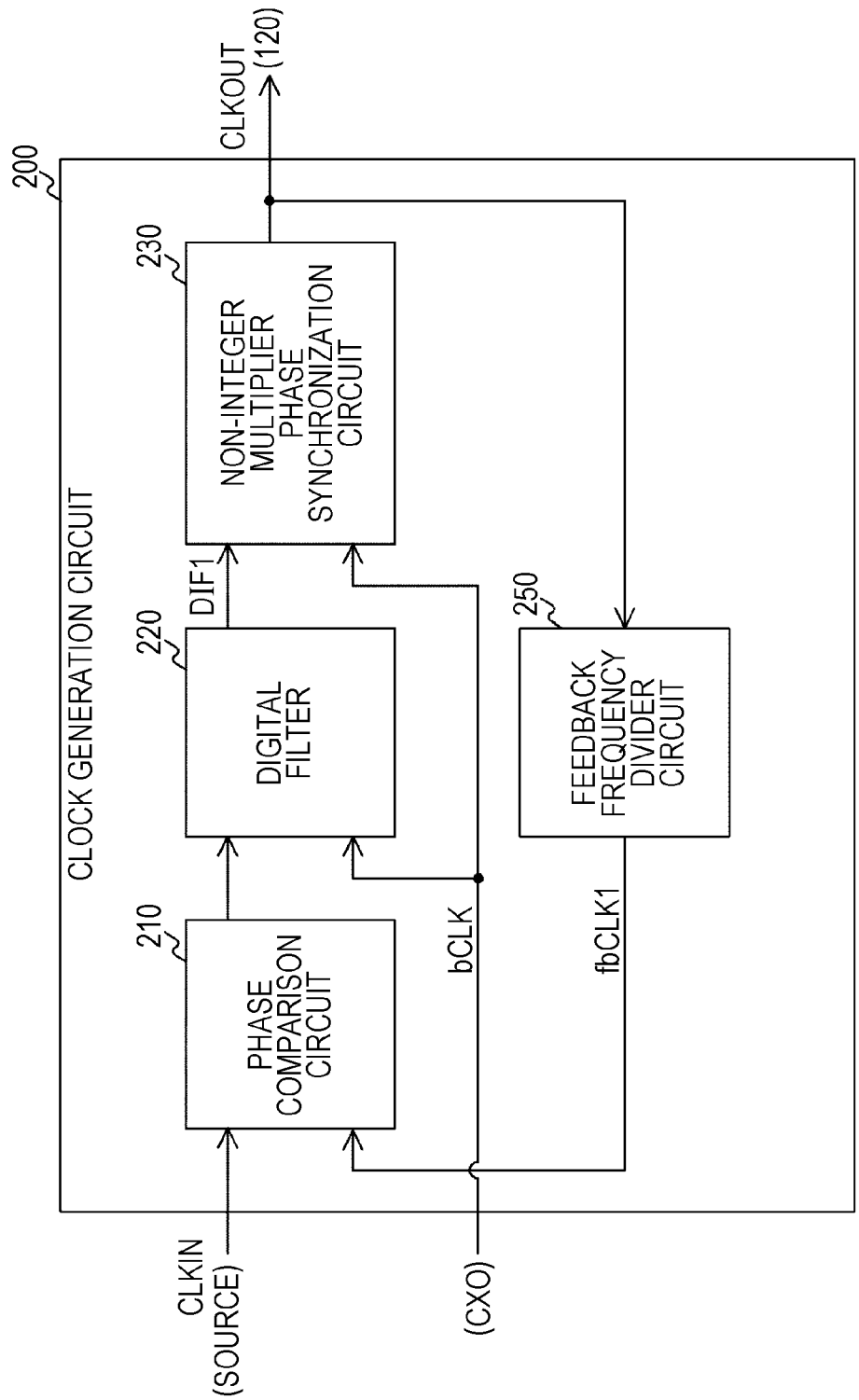
FIG. 2 is a block diagram illustrating an example of configuration of a clock generation circuit according to the first embodiment.

FIG. 2 is a block diagram illustrating an example of configuration of the clock generation circuit 200 according to the first embodiment. This clock generation circuit 200 includes a phase comparison circuit 210, a digital filter 220, a non-integral multiplier phase synchronization circuit 230, and a feedback frequency divider circuit 250.

The phase comparison circuit 210 detects the phase difference by comparing the phases of the input clock signal CLKIN and the feedback signal fbCLK1. The phase comparison circuit 210 generates a phase difference signal DIF1 indicating the detected phase difference, and provides it to the digital filter 220.

The digital filter 220 suppresses a high frequency component than a predetermined cutoff frequency in the phase difference signal DIF1. This digital filter 220 may be, for example, an IIR (Infinite Impulse Response) filter and an FIR (Finite Impulse Response) filter. The operation clock of the digital filter 220 may be, for example, the reference clock signal bCLK given by the crystal oscillator CXO. The digital filter 220 provides the phase difference signal DIF1, of which high frequency component is suppressed, to the non-integral multiplier phase synchronization circuit 230. The digital filter 220 is an example of a filter circuit as described in the claims.

As compared with the configuration using the analog filter, the use of the digital filter 220 can reduce the increase in the size of area of the filter even if the frequency of the reference clock signal bCLK is low. In addition, this makes it unnecessary to have components be provided outside of the LSI (Large Scale Integration). Still more, the digital filter 220 is a combination of logic circuits, and therefore, with the progress in the technique of LSI manufacturing process, the digital filter 220 can be made into a smaller size, consume less power, and increase the speed.

An analog filter may be used instead of the digital filter 220, as long as the high frequency component can be suppressed in the phase difference signal DIF1.

The non-integral multiplier phase synchronization circuit 230 performs sigma delta modulation on the phase difference signal DIF1 of which high frequency component has been suppressed. This non-integral multiplier phase synchronization circuit 230 generates the output clock signal CLKOUT from the reference clock signal bCLK and the phase difference signal DIF1 on which the sigma delta modulation has been performed, and provides the output clock signal CLKOUT to the AD conversion circuit 110, the logic circuit 120, and the feedback frequency divider circuit 250. It should be noted that the non-integral multiplier phase synchronization circuit 230 is an example of an output circuit as described in the claims.

The feedback frequency divider circuit 250 divides the frequency of the output clock signal CLKOUT with a predetermined frequency dividing ratio, and feeds it back to the phase comparison circuit 210 as a feedback signal fbCLK1. The feedback frequency divider circuit 250 is constituted by, for example, a counter circuit and the like. In the feedback frequency divider circuit 250, the frequency dividing ratio is set to, for example, $160 \times 10^3$. Therefore, when the frequency of the input clock signal CLKIN is 10 kHz, an output clock signal CLKOUT of 160 MHz is generated. It should be noted that the feedback frequency divider circuit 250 is an example of a frequency dividing circuit as described in the claims.

[Example of Configuration of Non-Integral Multiplier Phase Synchronization Circuit]

Figure 3:
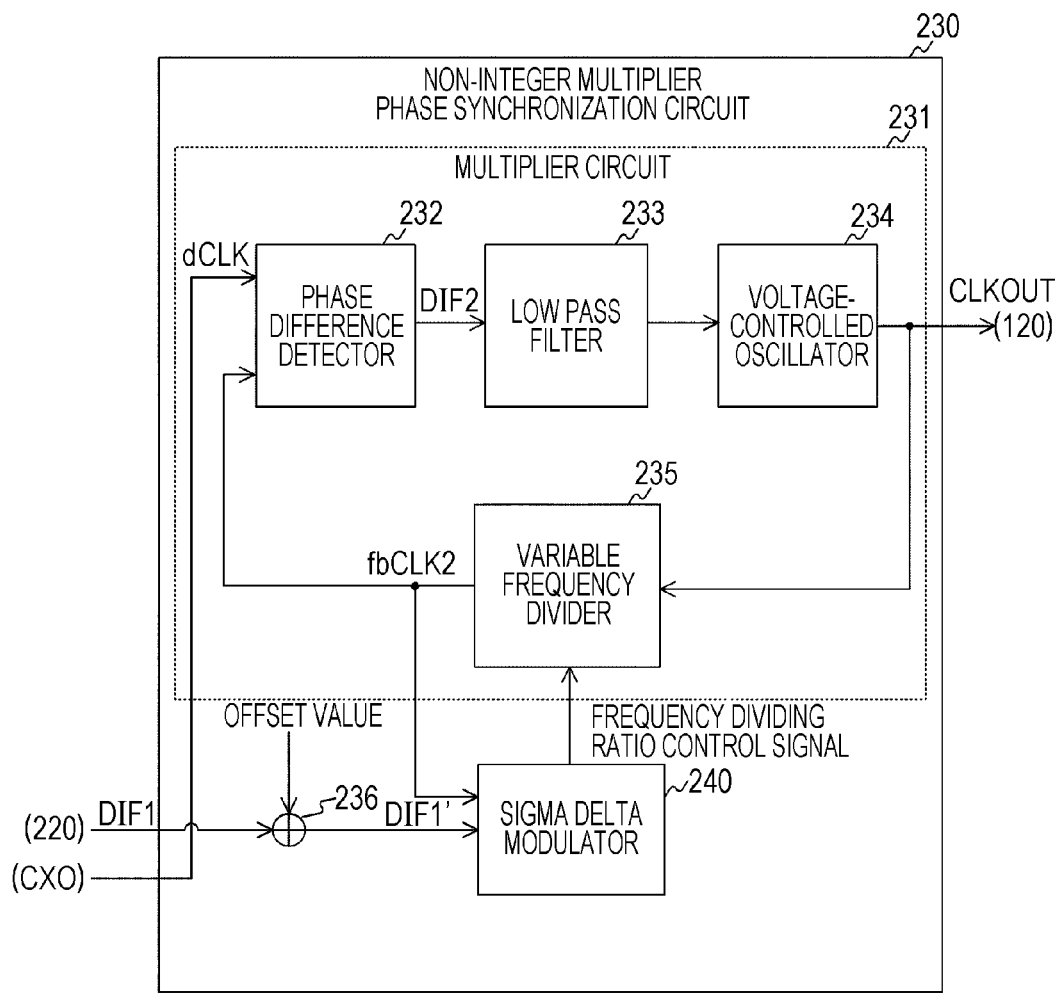
FIG. 3 is a block diagram illustrating an example of configuration of a non-integral multiplier phase synchronization circuit according to the first embodiment.

FIG. 3 is a block diagram illustrating an example of configuration of the non-integral multiplier phase synchronization circuit 230 according to the first embodiment. This non-integral multiplier phase synchronization circuit 230 includes a multiplier circuit 231, an adder 236, and a sigma delta modulator 240. The multiplier circuit 231 includes a phase difference detector 232, a low pass filter 233, an oscillator 234, and a variable frequency divider 235.

The adder 236 adds a predetermined offset value to the value of the phase difference signal DIF1. This adder 236 provides the signal having the offset value added thereto to the sigma delta modulator 240 as a phase difference signal DIF1'. The value of this phase difference signal DIF1' indicates the setting value of the frequency dividing ratio which is set in the variable frequency divider 235. It should be noted that the adder 236 is an example of an adjustment unit as described in the claims.

The sigma delta modulator 240 generates a frequency dividing ratio control signal by performing sigma delta modulation on the phase difference signal DIF1'. This frequency dividing ratio control signal is a signal for controlling the frequency dividing ratio of the variable frequency divider 235. For example, one-bit signal is used as the frequency dividing ratio control signal.

In this case, in the variable frequency divider 235, the frequency dividing ratio can be controlled to be any one of "2" and "3". In this configuration, for example, when the frequency dividing ratio is controlled to be "2", the frequency dividing ratio control signal is set to the value "0". When the frequency dividing ratio is controlled to be "3", the frequency dividing ratio control signal is set to the value "1". Alternatively, the frequency dividing ratio control signal may be a multi-bit signal.

The sigma delta modulator 240 performs sigma delta modulation processing, so that the average value of the frequency dividing ratio of the variable frequency divider 235 attains a value approximate to the value of the phase difference signal DIF1'. For example, when the value of the phase difference signal DIF1' is "2.5", the sigma delta modulator 240 outputs a phase difference control signal "0" and a phase difference control signal "1" at the same occurrence. As a result, the frequency dividing ratio is controlled to be "2" and "3" at the same occurrence, and the average value thereof becomes "2.5". When the value of the phase difference signal DIF1' is "2.25", the sigma delta modulator 240 sets the ratio of "0":"1" to 1:3, and controls the average value of the frequency dividing ratio so that it attains a value of "2.25". It should be noted that the sigma delta modulator 240 is an example of a modulator as described in the claims.

As described above, the sigma delta modulator 240 generates time-series output data in which the average value of the frequency dividing ratio control signal of the variable frequency divider 235 is equal to DIF1'. At this occasion, due to the noise shaping effect of the sigma delta modulation, the low frequency component of the quantization noise generated in the average code generation is suppressed, and the high frequency component increases. The high frequency component of this quantization noise is suppressed by a low pass filter 233, and therefore, the non-integral multiplier phase synchronization circuit 230 can generate the output clock signal CLKOUT including less jitter.

The multiplier circuit 231 generates the output clock signal CLKOUT by multiplying the reference clock signal bCLK by a multiplication ratio corresponding to the frequency dividing ratio that is set by the sigma delta modulator 240. The frequency of this output clock signal CLKOUT is controlled to be a frequency F (CLKOUT) represented by the following expression.

$$F(\text{CLKOUT}) = F(b\text{CLK}) \times \text{AVG}(N) \quad \text{Expression 1}$$

In the expression 1, F (bCLK) denotes the frequency of the reference clock signal bCLK. AVG (N) denotes an average value of the frequency dividing ratio controlled by the sigma delta modulator 240. This AVG (N) is expressed by the following expression.

$$AVG(N) = F(CLKIN) \times Nc \times 1/F(bCLK) \qquad \text{Expression 2}$$

In the expression 2, F (CLKIN) denotes the frequency of the input clock signal CLKIN, and Nc denotes the frequency dividing ratio in the feedback frequency divider circuit 250. For example, where F (CLKIN) is 10 kHz and F (bCLK) is 48 MHz, Nc is set to $160 \times 10^3$, and AVG (N) is set to 1/(0.3). Therefore, F (CLKOUT) is controlled to be 160 MHz on the basis of the expression 1 and the expression 2. The offset value added by the adder 236 is set so that the value of the phase difference signal DIF1' becomes AVG (N) in the expression 1 and the expression 2. In this case, the non-integral multiplier phase synchronization circuit 230 adjusts the value of the phase difference signal by performing processing of adding the offset value to produce the frequency dividing ratio, but the configuration is not limited thereto as long as the adjusted value becomes AVG (N) satisfying the expressions 1 and 2. For example, adjustment may be done by processing for subtracting the offset value or processing for multiplying the offset value. When the value of the phase difference signal DIF1 can be used for the frequency dividing ratio as it is, it is not necessary to provide the adder 236.

For example, in the configuration where the non-integral multiplier phase synchronization circuit 230 is used as an oscillator as shown in the expression, the frequency of the output clock signal CLKOUT is controlled by the average value AVG (N). Therefore, as compared with the configuration where an NCO and the like is used as an oscillator, the clock generation circuit 200 can generate an output clock signal CLKOUT of a high frequency.

When the non-integral multiplier phase synchronization circuit 230 is used as an oscillator, an appropriate limitation is set for the value of the phase difference signal DIF1, and therefore, a certain range of frequency can be maintained in the output clock signal CLKOUT.

Depending on the application, the clock generation circuit 200 can continue to oscillate in a certain range of frequency even if the reference clock signal bCLK stops.

The phase difference detector 232 detects the phase difference by comparing the phase differences of the reference clock signal bCLK and the feedback signal fbCLK2. This phase difference detector 232 generates a phase difference signal DIF2 indicating the detected phase difference and provides it to the low pass filter 233.

The low pass filter 233 suppresses a high frequency component higher than a predetermined cutoff frequency in the phase difference signal DIF2. This low pass filter 233 provides the phase difference signal DIF2, of which high frequency component is suppressed, to the oscillator 234. The cutoff frequency of the low pass filter 233 is set to be a predetermined value independently from the cutoff frequency of the digital filter 220.

The oscillator 234 generates the output clock signal CLKOUT by oscillating at the frequency according to the phase difference of the phase difference signal DIF2.

The oscillator 234 outputs the generated output clock signal CLKOUT to the variable frequency divider 235, the feedback frequency divider circuit 250, the AD conversion circuit 110, and the logic circuit 120. It should be noted that the oscillator 234 is an example of an oscillator as described in the claims.

The variable frequency divider 235 divides the frequency of the output clock signal CLKOUT by the frequency dividing ratio controlled by the sigma delta modulator 240. This variable frequency divider 235 provides the frequency-divided signal to the phase difference detector 232 and the sigma delta modulator 240 as the feedback signal fbCLK2.

In a generally-available usage method of the non-integral multiplier phase synchronization circuit 230, the sigma delta modulator 240 receives a fixed value indicating the frequency dividing ratio instead of the phase difference signal DIF1', and the non-integral multiplier phase synchronization circuit 230 directly receives the input clock signal CLKIN. However, in this configuration, the band of the non-integral multiplier phase synchronization circuit 230 needs to be sufficiently reduced (by, for example, one digit or more) with respect to the frequency of the input clock signal CLKIN. Therefore, the size of the low pass filter 233 needs to be such size that makes it difficult to be implemented on the LSI (Large Scale Integration). In this case, instead of the low pass filter 233, it is necessary to arrange a capacitance device and the like, and therefore, there is a drawback in the cost of components and the selection of an LSI package. On the other hand, when the loop band is reduced in order to suppress the size of the low pass filter 233 in this configuration, this makes it difficult to suppress the noise components generated by the constituent elements of the oscillator 234.

As described above, according to the first embodiment of the present technique, the clock generation circuit 200 modulates the phase difference signal to reduce the noise component of the low frequency band and increase the noise component of the high frequency band. Therefore, the clock generation circuit 200 can generate the clock signal of any frequency, of which noises in the low frequency band and high frequency band are sufficiently reduced, in synchronization with the reference clock signal.

[First Modification]

In the first embodiment, the source separately transmit the analog signal and the input clock signal CLKIN.

Alternatively, the source may transmit an analog signal having an input clock signal CLK superimposed thereon.

The electronic device 100 according to the first modification is different from the first embodiment in that the electronic device 100 receives only the analog signal having the input clock signal CLK superimposed thereon from the source.

Figure 4:
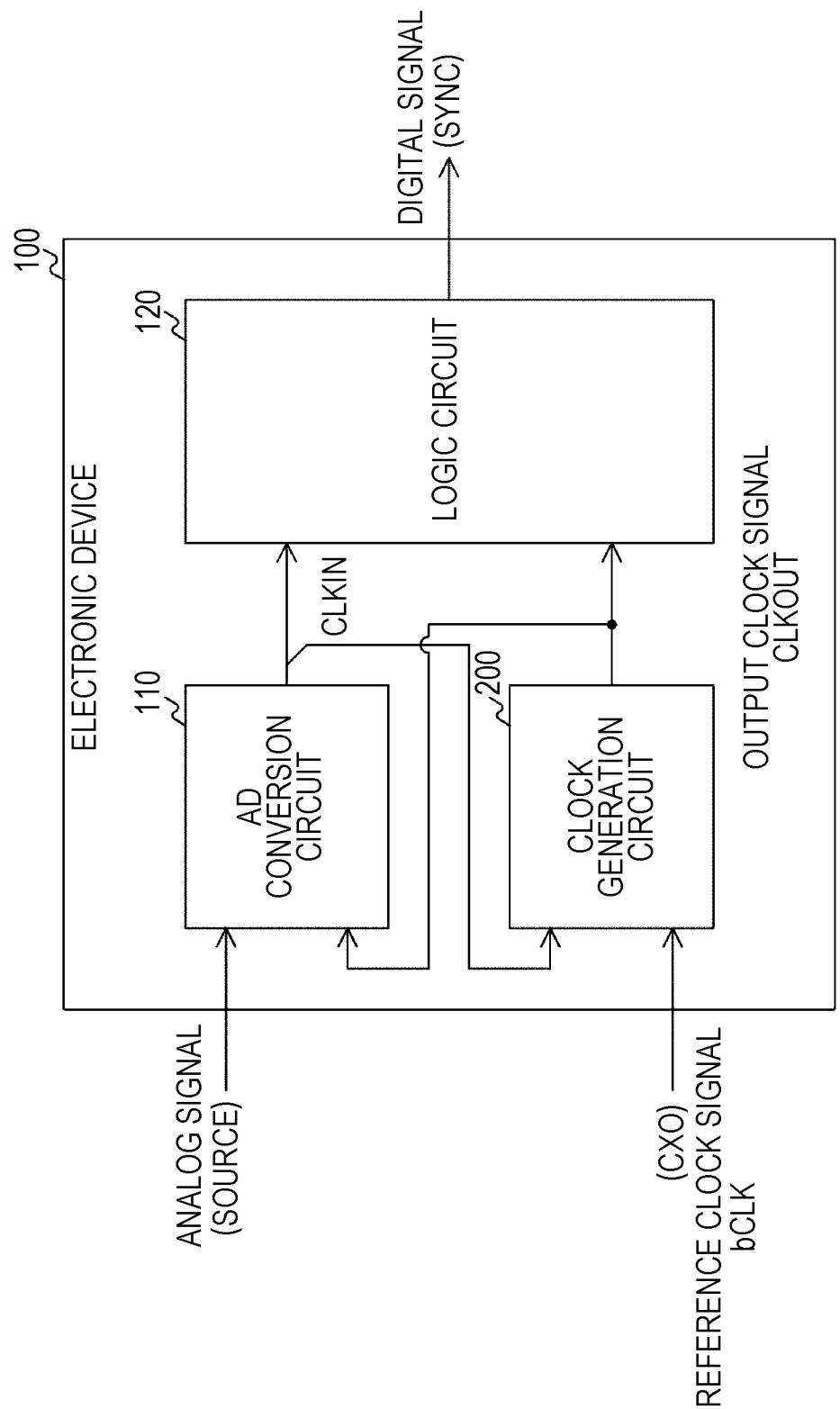
FIG. 4 is a block diagram illustrating an example of configuration of an electronic device according to a first modification of the first embodiment.

FIG. 4 is a block diagram illustrating an example of configuration of the electronic device 100 according to the first modification of the first embodiment. The AD conversion circuit 110 according to the first modification is different from the first embodiment in that only the analog signal having the input clock signal CLK superimposed thereon is received from the source.

This AD conversion circuit 110 separates the input clock signal CLKIN from the analog signal, and provides the input clock signal CLKIN to the clock generation circuit 200.

As described above, according to the first modification, only the analog signal having the input clock signal CLK superimposed thereon is received from the source, and therefore, it is not necessary to provide any signal line for transmitting and receiving the input clock signal CLK to/from the source.

[Second Modification]

According to the first embodiment, the electronic device 100 provides the generated output clock signal CLKOUT to only the AD conversion circuit 110 and the logic circuit 120. In addition, the output clock signal CLKOUT may be further output to an external device. An electronic device 100 according to the second modification is different from the first embodiment in that the output clock signal CLKOUT is output to an external device.

Figure 5:
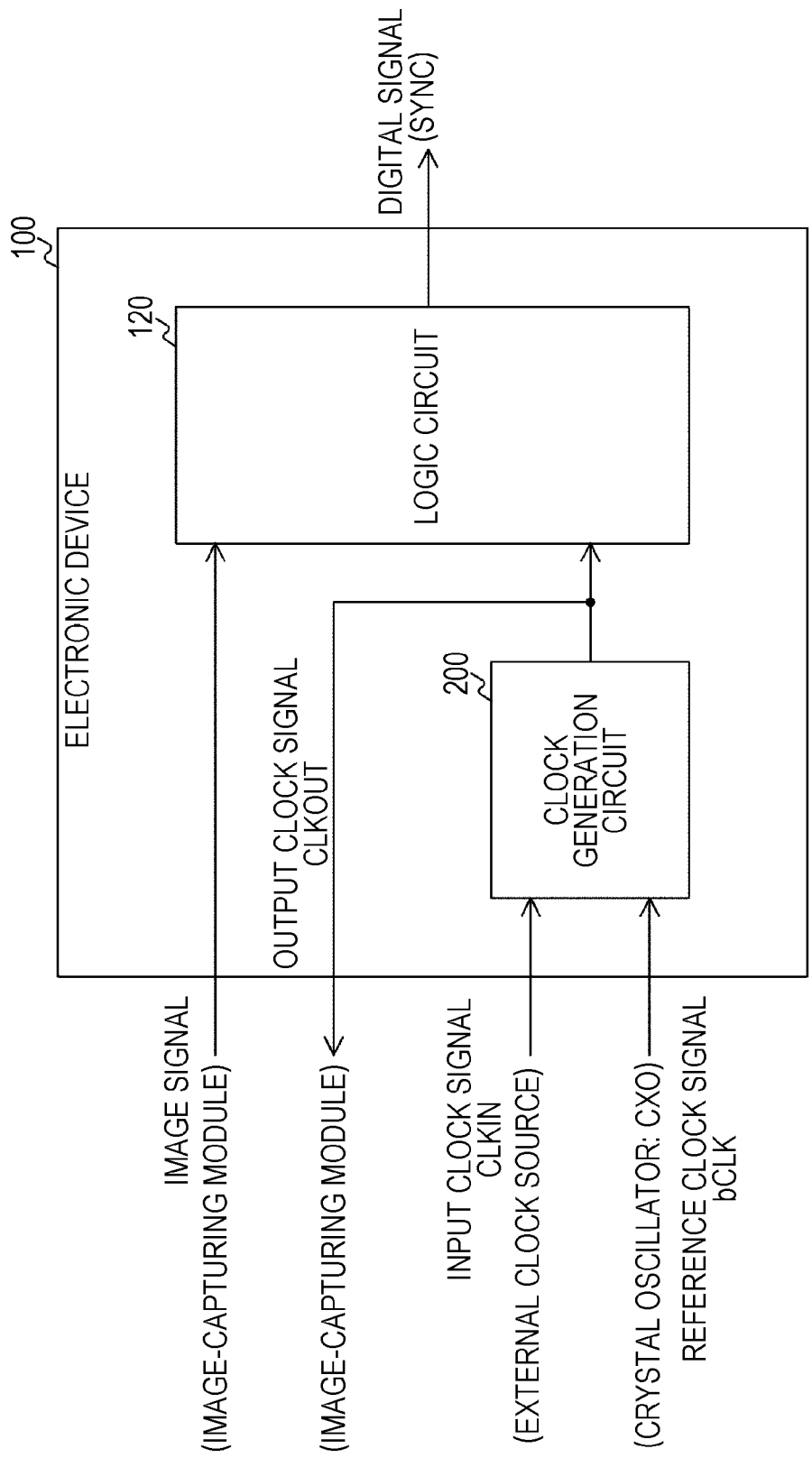
FIG. 5 is a block diagram illustrating an example of configuration of an electronic device according to a second modification of the first embodiment.

FIG. 5 is a block diagram illustrating an example of configuration of the electronic device 100 according to the second modification of the first embodiment. The electronic device 100 according to the second modification is different from the first embodiment in that the electronic device 100 according to the second modification does not have the AD conversion circuit 110. The clock generation circuit 200 according to the second modification receives the input clock signal CLKIN from an external clock source, and transmits the output clock signal CLKOUT to an external device such as an image-capturing module. The image-capturing module generates an image signal in synchronization with the output clock signal CLKOUT, and provides the image signal to the logic circuit 120.

In the second modification, for example, the input clock signal CLKIN is 60 Hz, and the frequency dividing ratio in the feedback frequency divider circuit 250 is set to $0.5 \times 10^3$. Therefore, an output clock signal CLKOUT of 30 MHz is output.

According to the second modification as described above, the clock generation circuit 200 further outputs the output clock signal CLKOUT to an external device, and therefore, the external device can generate an image signal and the like in synchronization with the output clock signal.

[Third Modification]

In the first embodiment, the reference clock signal bCLK is used as a driving clock signal of the digital filter 220, but the configuration is not limited thereto as long as calculation is completed within the oscillation period. For example, the output clock signal CLKOUT may be used as the driving clock signal instead of the reference clock signal bCLK. A clock generation circuit 200 according to the third modification is different from the first embodiment in that the output clock signal CLKOUT is used as the driving clock oscillation instead of the reference clock signal bCLK.

Figure 6:
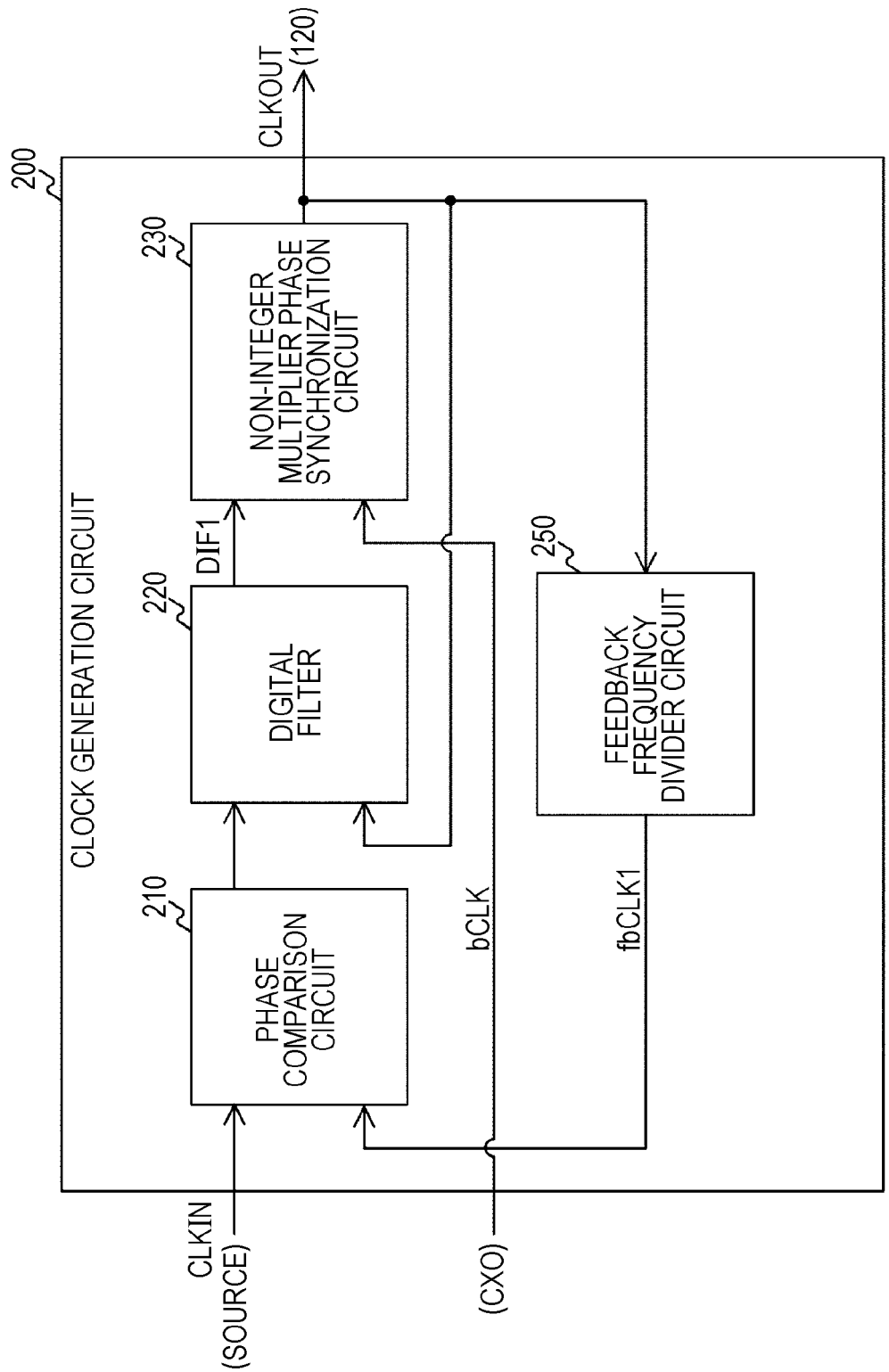
FIG. 6 is a block diagram illustrating an example of configuration of a clock generation circuit according to a third modification of the first embodiment.

FIG. 6 is a block diagram illustrating an example of configuration of the clock generation circuit 200 according to the third modification of the first embodiment. The clock generation circuit 200 according to the third modification is different from the first embodiment in that the digital filter 220 operates in synchronization with the output clock signal CLKOUT.

As described above, according to the third modification, the digital filter 220 operates in synchronization with the output clock signal CLKOUT.

[Fourth Modification]

According to the first embodiment, in the non-integral multiplier phase synchronization circuit 230, the reference clock signal is input into the phase difference detector 232 as it is, and the output clock signal CLKOUT is output as it is. However, in the non-integral multiplier phase synchronization circuit 230, the frequency of the reference clock signal bCLK may be divided and input into the phase difference detector 232, and the frequency of the output clock signal CLKOUT may be divided and output. The non-integral multiplier phase synchronization circuit 230 according to the fourth modification is different from the first embodiment in that the frequency of the reference clock signal is divided and input into the phase difference detector 232, and the frequency of the output clock signal CLKOUT is divided and output.

Figure 7:
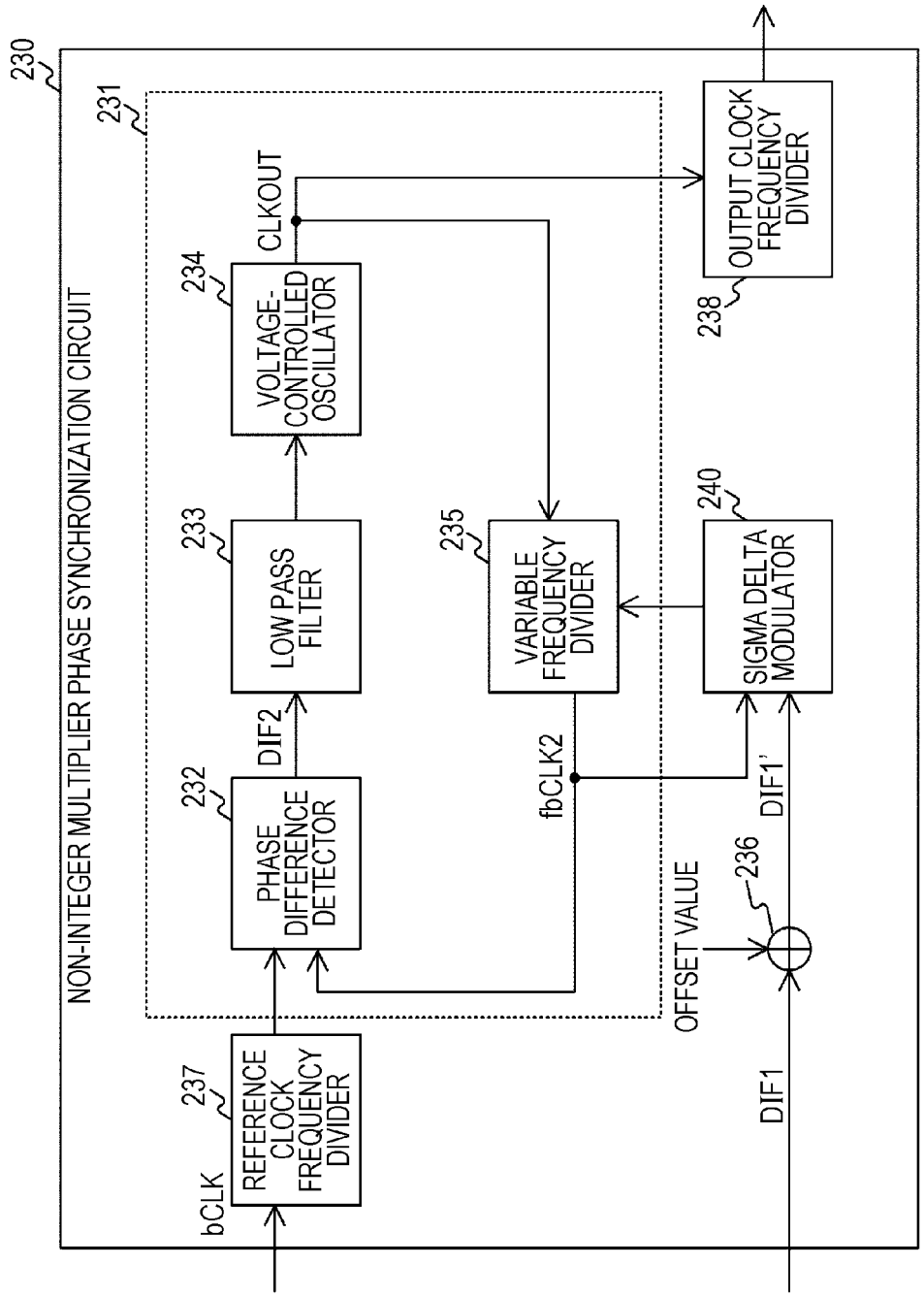
FIG. 7 is a block diagram illustrating an example of configuration of a non-integral multiplier phase synchronization circuit according to a fourth modification of the first embodiment.

FIG. 7 is a block diagram illustrating an example of configuration of the non-integral multiplier phase synchronization circuit 230 according to the fourth modification of the first embodiment. The non-integral multiplier phase synchronization circuit 230 according to the fourth modification is different from the first embodiment in that the non-integral multiplier phase synchronization circuit 230 according to the fourth modification includes a reference clock frequency divider 237 and an output clock frequency divider 238.

The reference clock frequency divider 237 divides the frequency of the reference clock signal bCLK, and inputs the reference clock signal bCLK into the phase difference detector 232. The output clock frequency divider 238 divides the frequency of the output clock signal CLKOUT, and feeds the output clock signal CLKOUT back to the feedback frequency divider circuit 250.

It should be noted that the non-integral multiplier phase synchronization circuit 230 is configured to include both of the reference clock frequency divider 237 and the output clock frequency divider 238. Alternatively, the non-integral multiplier phase synchronization circuit 230 may include any one of the reference clock frequency divider 237 and the output clock frequency divider 238.

As described above, according to the fourth modification, the non-integral multiplier phase synchronization circuit 230 divides the frequency of the reference clock signal bCLK and the frequency of the output clock signal CLKOUT, and therefore, as compared with a case where they are not frequency-divided, the output clock signal CLKOUT of various frequencies can be generated.

2. Second Embodiment

In the first embodiment, the input clock signal CLKIN is input into the phase comparison circuit 210 as it is. Alternatively, the phase of the input clock signal CLKIN is controlled to match the phase of the output clock signal CLKOUT, and then the input clock signal CLKIN may be input into the phase comparison circuit 210. A clock generation circuit 200 according to the second embodiment is different from the first embodiment in that the phase of the input clock signal CLKIN is controlled to match the phase of the output clock signal CLKOUT.

Figure 8:
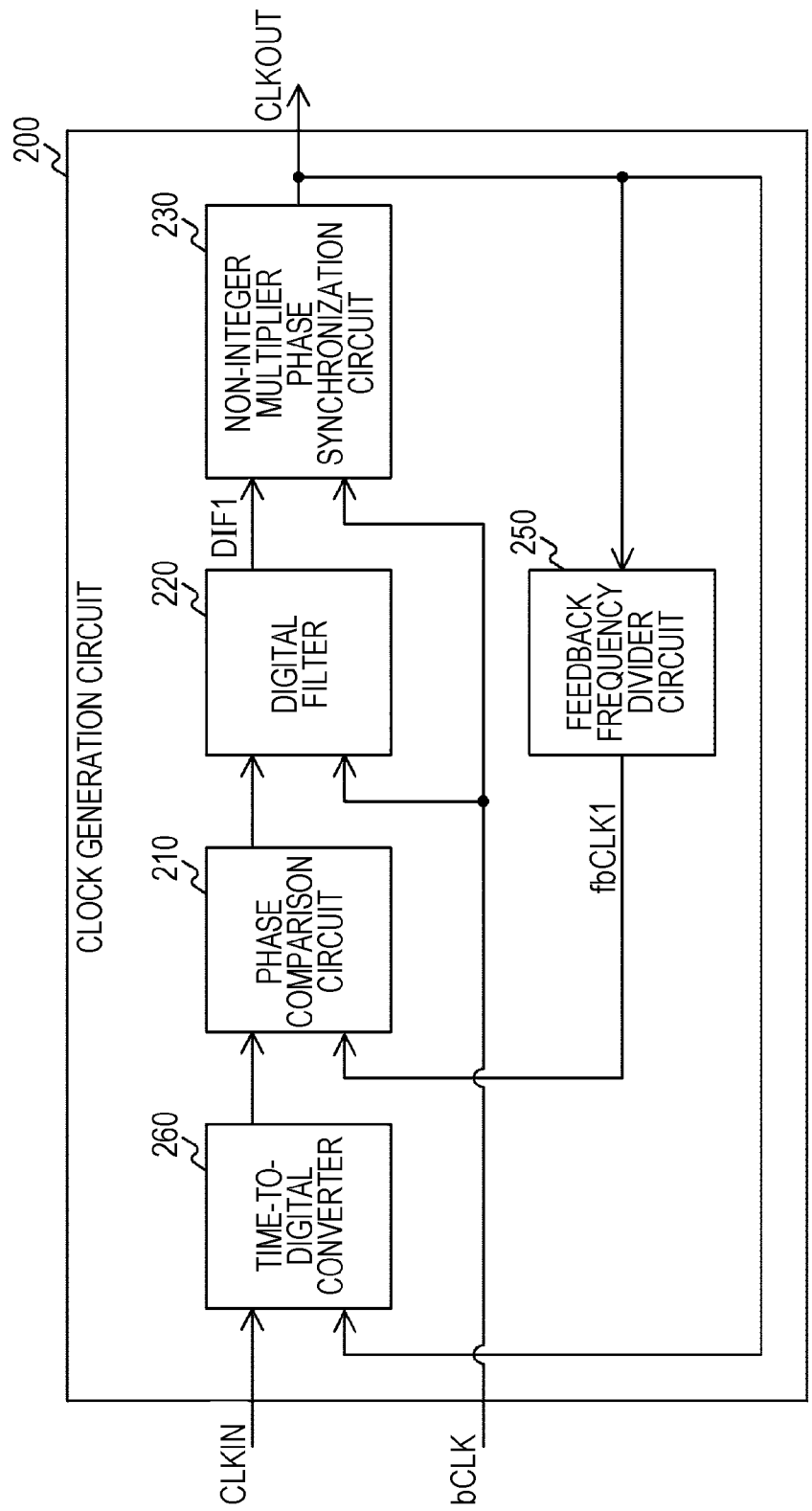
FIG. 8 is a block diagram illustrating an example of configuration of a clock generation circuit according to a second embodiment.

FIG. 8 is a block diagram illustrating an example of configuration of the clock generation circuit 200 according to the second embodiment. Therefore, the clock generation circuit 200 according to the second embodiment is different from the first embodiment in that the clock generation circuit 200 according to the second embodiment further includes a time-to-digital converter 260.

The time-to-digital converter 260 detects edge positions of the input clock signal CLKIN at a resolution finer than the clock period of the input clock signal CLKIN, and outputs a digital value indicating the detection result. This time-to-digital converter 260 uses the output clock signal CLKOUT and the like as the reference clock signal to detect edge positions of the input clock signal CLKIN at a resolution according to the frequency of the reference clock signal. Then, the time-to-digital converter 260 provides the detection result to the phase comparison circuit 210. The phase comparison circuit 210 compares the phase difference between the edge position indicating the detection result and the edge position of the feedback signal fbCLK1.

In the first embodiment not provided with the time-to-digital converter 260, the resolution of the phase comparison is 1/F (CLKOUT). Even if F (CLKOUT) is high such as 1 GHz, the resolution thereof is about 1 nanosecond (ns). In a case where the phase difference of the frequency-divided feedback signal and the output clock signal CLKOUT is equal to or less than the resolution, the frequency control is not performed by the oscillator 234, which causes jitter. In contrast, in the second embodiment, the time-to-digital converter 260 detects edge positions of the input clock signal CLKIN at the resolution according to the frequency of the output clock signal CLKOUT (reference clock signal). Therefore, the phase resolution can be improved as compared with the first embodiment. Therefore, the jitter is further reduced.

The non-integral multiplier phase synchronization circuit 230 according to the second embodiment provides the output clock signal CLKOUT to not only the AD conversion circuit 110, the logic circuit 120, and the feedback frequency divider circuit 250 but also the time-to-digital converter 260.

As described above, according to the second embodiment, the clock generation circuit 200 can detect the edges of the input clock signal on the basis of the reference clock signal of which frequency is higher than the input clock signal, and therefore, the phase resolution can be improved. Therefore, the noises can be further reduced.

[Modification]

According to the second embodiment, the reference clock signal bCLK is used as the driving clock signal of the digital filter 220. Alternatively, the output clock signal CLKOUT may be used as the driving clock signal instead of the reference clock signal bCLK. The clock generation circuit 200 according to the modification of the second embodiment is different from the second embodiment in that the output clock signal CLKOUT is used as the driving clock oscillation instead of the reference clock signal bCLK.

Figure 9:
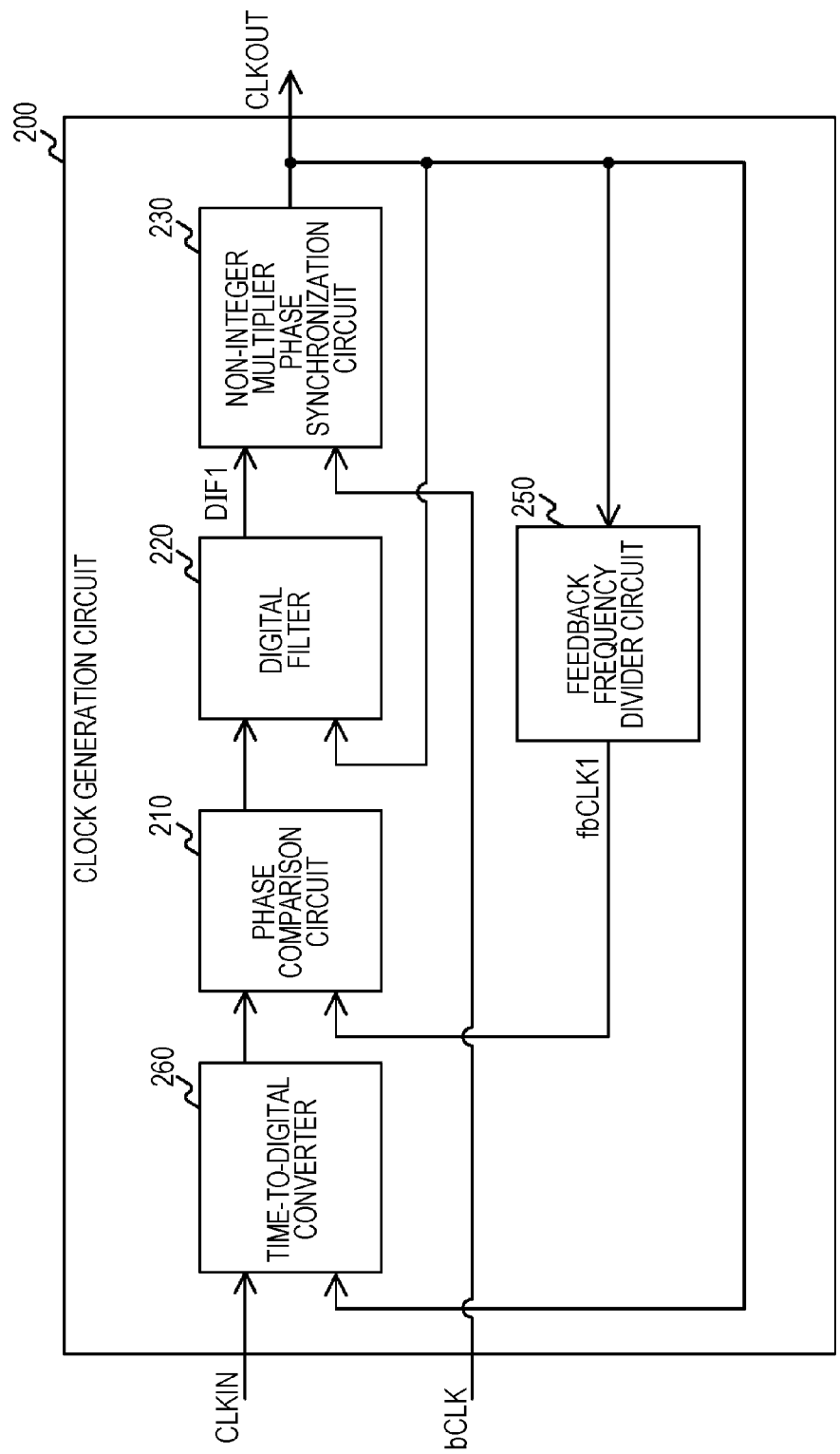
FIG. 9 is a block diagram illustrating an example of configuration of a clock generation circuit according to a modification of the second embodiment.

FIG. 9 is a block diagram illustrating an example of configuration of the clock generation circuit 200 according to the modification of the second embodiment.

The clock generation circuit 200 according to the modification is different from the second embodiment in that the digital filter 220 operates in synchronization with the output clock signal CLKOUT.

As described above, according to the modification, the digital filter 220 can be caused to operate in synchronization with the output clock signal CLKOUT.

The above embodiments show examples for carrying out the present technique, and each of the matters described in the embodiments corresponds to and is related to each of the invention-specifying matters described in the claims. Likewise, there is a corresponding relationship between each of the invention-specifying matters described in the claims corresponds to and is related to each of the matters in the embodiments of the present technique denoted with the same name as the invention-specifying matter described in the claims. However, the present technique is not limited to the embodiments, and may be embodied by applying various modifications to the embodiments without deviating from the gist thereof.

The processing procedure explained in the above embodiments may be understood as a method having the series of procedures, and may be understood as a program for causing a computer to execute the series of procedures and a recording medium storing the program. Examples of recording media can include a CD (Compact Disc), an MD (MiniDisc), a DVD (Digital Versatile Disc), memory card, Blu-ray (registered trademark) Disc, and the like.

The advantages described here are not necessarily limited. Any one of the effects described in the present disclosure may be achieved.

The present technique may be configured as follows.

(1) A clock generation circuit including:

a phase difference comparison circuit configured to compare a phase of each of an input clock signal and a feedback signal which have been received, and provides a phase difference signal indicating a phase difference between the input clock signal and the feedback signal;

a filter circuit configured to suppress a high frequency component, of which frequency is higher than a predetermined cutoff frequency, in the phase difference signal;

an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal; and a frequency dividing circuit configured to divide a frequency of the output clock signal, which has been output, at a predetermined frequency dividing ratio, and feed the output clock signal back to the phase comparison circuit as the feedback signal.

(2) The clock generation circuit according to (1), wherein the output circuit includes:

a modulator configured to modulate the phase difference signal of which high frequency component has been suppressed; and a multiplier circuit configured to multiply the reference clock signal by a multiplication ratio according to the phase difference indicated by the frequency dividing ratio setting signal which has been modulated, and output the output clock signal.

(3) The clock generation circuit according to (2), wherein the output circuit further includes an adjustment unit configured to adjust the phase difference indicated by the phase difference signal so that it attains a value obtained by multiplying a ratio of a frequency of the reference clock signal with respect to a frequency of the input clock signal by the predetermined frequency dividing ratio, and input the phase difference signal indicating the adjusted value into the modulator.

(4) The clock generation circuit according to (3), wherein the multiplier circuit includes:

a phase difference detector configured to compare phases of the reference clock signal and an internal signal, and detect a phase difference between the reference clock signal and the internal signal;

an oscillator configured to oscillate at a frequency according to the phase difference detected by the phase difference detector, and generate the output clock signal; and a variable frequency divider configured to divide a frequency of the output clock signal, which has been generated, at a frequency dividing ratio equal to the value indicated by the phase difference signal which has been modulated, and feed the output clock signal back to the phase difference detector as the internal signal.

(5) The clock generation circuit according to any one of (1) to (4) further including a detection circuit configured to provide the phase comparison circuit with a detection result obtained by detecting an edge of the input clock signal on the basis of a reference clock signal of a frequency higher than the input clock signal.

(6) The clock generation circuit according to (5), wherein the detection circuit detects an edge of the input clock signal on the basis of the output clock signal.

(7) The clock generation circuit according to any one of (1) to (6), wherein the modulation performed on the phase difference signal is sigma delta modulation.

(8) An electronic device including:
a reference clock providing circuit configured to provide a predetermined reference clock signal;
a phase difference comparison circuit configured to compare a phase of each of an input clock signal and a feedback signal which have been input, and provides a phase difference signal indicating a phase difference between the input clock signal and the feedback signal;
a filter circuit configured to suppress a high frequency component, of which frequency is higher than a predetermined cutoff frequency, in the phase difference signal;
an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal; and a frequency dividing circuit configured to divide a frequency of the output clock signal, which has been output, at a predetermined frequency dividing ratio, and feed the output clock signal back to the phase comparison circuit as the feedback signal.

REFERENCE SIGNS LIST

100 Electronic device
110 AD conversion circuit
120 Logic circuit
200 Clock generation circuit
210 Phase comparison circuit
220 Digital filter
230 Non-integral multiplier phase synchronization circuit
231 Multiplier circuit
232 Phase difference detector
233 Low pass filter
234 Oscillator
235 Variable frequency divider
236 Adder
237 Reference clock frequency divider
238 Output clock frequency divider
240 Sigma delta modulator
241 Subtracter
242 Integrator
243 Adder
244, 246 Delay memory
245 Quantizer
250 Feedback frequency divider circuit
260 Time-to-digital converter

The invention claimed is:

1. A clock generation circuit comprising:
a phase difference comparison circuit configured to compare a phase of each of an input clock signal and a feedback signal which have been received, and provides a phase difference signal indicating a phase difference between the input clock signal and the feedback signal;
a filter circuit configured to suppress a high frequency component, of which frequency is higher than a predetermined cutoff frequency, in the phase difference signal;
an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal; and
a frequency dividing circuit configured to divide a frequency of the output clock signal, which has been output, at a predetermined frequency dividing ratio, and feed the output clock signal back to the phase comparison circuit as the feedback signal.

2. The clock generation circuit according to claim 1, wherein the output circuit includes:
a modulator configured to modulate the phase difference signal of which high frequency component has been suppressed; and
a multiplier circuit configured to multiply the reference clock signal by a multiplication ratio according to the phase difference indicated by the frequency dividing ratio setting signal which has been modulated, and output the output clock signal.

3. The clock generation circuit according to claim 2, wherein the output circuit further includes an adjustment unit configured to adjust the phase difference indicated by the phase difference signal so that it attains a value obtained by multiplying a ratio of a frequency of the reference clock signal with respect to a frequency of the input clock signal by the predetermined frequency dividing ratio, and input the phase difference signal indicating the adjusted value into the modulator.

4. The clock generation circuit according to claim 3, wherein the multiplier circuit includes:
a phase difference detector configured to compare phases of the reference clock signal and an internal signal, and detect a phase difference between the reference clock signal and the internal signal;
an oscillator configured to oscillate at a frequency according to the phase difference detected by the phase difference detector, and generate the output clock signal; and
a variable frequency divider configured to divide a frequency of the output clock signal, which has been generated, at a frequency dividing ratio equal to the value indicated by the phase difference signal which has been modulated, and feed the output clock signal back to the phase difference detector as the internal signal.

5. The clock generation circuit according to claim 1 further comprising a detection circuit configured to provide the phase comparison circuit with a detection result obtained by detecting an edge of the input clock signal on the basis of a clock signal of a frequency higher than the input clock signal.

6. The clock generation circuit according to claim 5, wherein the detection circuit detects an edge of the input clock signal on the basis of the output clock signal.

7. The clock generation circuit according to claim 1, wherein the modulation performed on the phase difference signal is sigma delta modulation.

8. An electronic device comprising:
a reference clock providing circuit configured to provide a predetermined reference clock signal;
a phase difference comparison circuit configured to compare a phase of each of an input clock signal and a feedback signal which have been input, and provides a phase difference signal indicating a phase difference between the input clock signal and the feedback signal;

a filter circuit configured to suppress a high frequency component, of which frequency is higher than a predetermined cutoff frequency, in the phase difference signal;

an output circuit configured to modulate the phase difference signal, of which high frequency component is suppressed, in such a manner as to decrease a noise component of a low frequency band and increase a noise component of a high frequency band, and generate and output an output clock signal from the modulated phase difference signal and a reference clock signal; and a frequency dividing circuit configured to divide a frequency of the output clock signal, which has been output, at a predetermined frequency dividing ratio, and feed the output clock signal back to the phase comparison circuit as the feedback signal.

* * * * *